United States Patent [19]
Knoop et al.

[11] Patent Number: 5,800,258
[45] Date of Patent: Sep. 1, 1998

[54] VENTILATION SYSTEM FOR CABINETS WITH ELECTRONIC FUNCTIONAL UNITS WHICH PRODUCE CONSIDERABLE HEAT

[75] Inventors: Franz-Josef Knoop, Büren-Steinhausen; Heinrich Schmidt, Delbrück-Boke, both of Germany

[73] Assignee: Siemens Nixdorf Informationssysteme Aktiengesellschaft, Paderborn, Germany

[21] Appl. No.: 530,294

[22] PCT Filed: Mar. 7, 1994

[86] PCT No.: PCT/DE94/00265

§ 371 Date: Sep. 22, 1995

§ 102(e) Date: Sep. 22, 1995

[87] PCT Pub. No.: WO94/22285

PCT Pub. Date: Sep. 29, 1994

[30] Foreign Application Priority Data

Mar. 23, 1993 [DE] Germany ............ 43 09 308.6

[51] Int. Cl.⁶ ...................................... H05K 7/20
[52] U.S. Cl. ............................. 454/184; 361/695
[58] Field of Search .................. 454/184; 361/695, 361/697

[56] References Cited

U.S. PATENT DOCUMENTS 4,674,004   6/1987   Smith et al. .
4,758,925   7/1988   Obata et al. .
5,136,464   8/1992   Ohmori .

FOREIGN PATENT DOCUMENTS 80 29 450   3/1981   Germany .
34 19 688  11/1985   Germany .
86 22 102   1/1989   Germany .
33 11 683  11/1989   Germany .

OTHER PUBLICATIONS

"Bis zu 600 m³/H Luftdurchsatz mit Diagonallüftern," *Markt & Technik*, No. 9, Feb. 26, 1993, pp. 35 & 37.

*Primary Examiner*—Harold Joyce
*Attorney, Agent, or Firm*—Hill & Simpson

[57] ABSTRACT

A ventilation system for a cabinet, such as a cabinet containing heat-producing components of a data processing system, those components being arranged stacked in the cabinet in tower fashion, has four identical fan units for drawing air over the components and discharging the air from the cabinet. The fan units are disposed at mid-height in the cabinet, and are divided into two pairs. The fan units in each pair have their respective air intake directions facing toward each other. The fan units of one pair are disposed directly one above the other, and the fan units of the other pair are disposed a distance apart, forming a horizontal air duct therebetween. Partitions are disposed in the cabinet for causing the fan units in the first pair to discharge air into the duct formed between the fan units of the other pair, the duct conducting the air to an exterior of the cabinet. The partitions cause the fan units of the other pair to discharge air in a direction out of the cabinet.

6 Claims, 2 Drawing Sheets

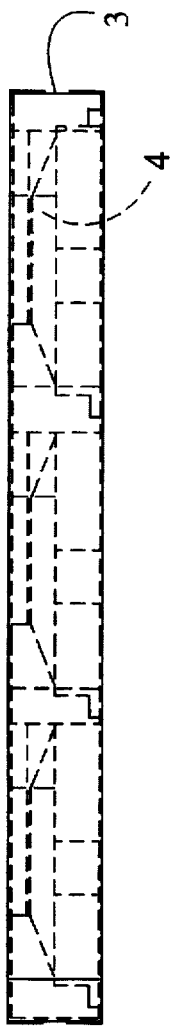
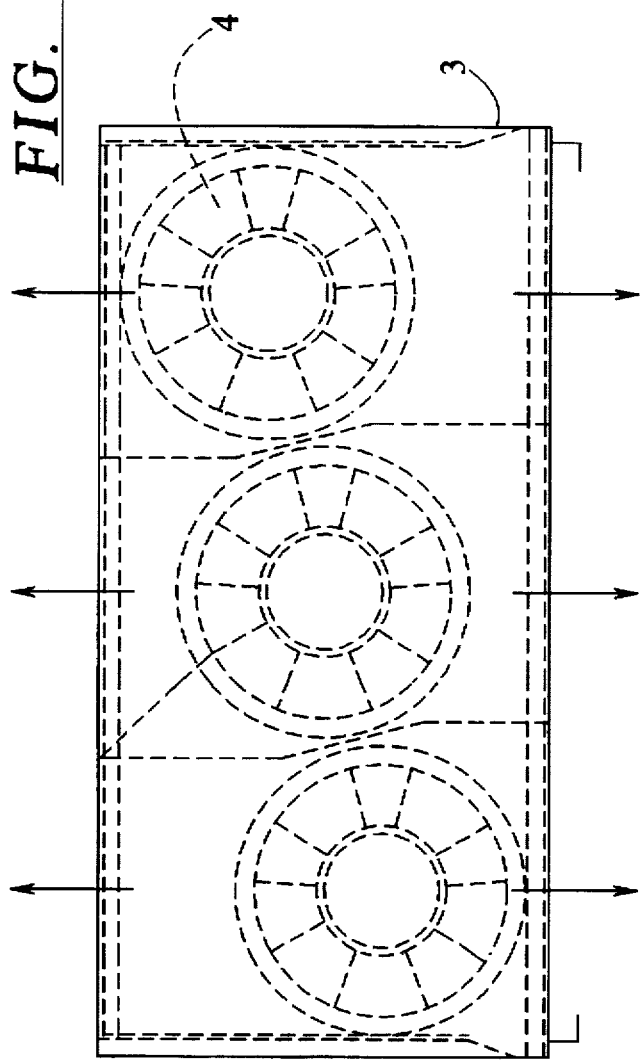
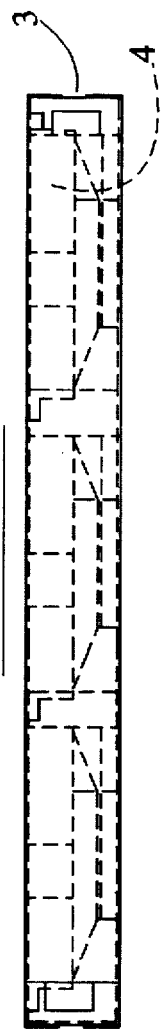
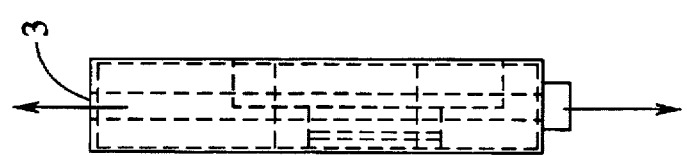
FIG. 2a
FIG. 2b
FIG. 2c
FIG. 2d

VENTILATION SYSTEM FOR CABINETS WITH ELECTRONIC FUNCTIONAL UNITS WHICH PRODUCE CONSIDERABLE HEAT

BACKGROUND OF THE INVENTION

1. Field of the Invention

The present invention relates to a ventilation system for cabinets with doors which are partly equipped with louvers in which electrical functional units are stacked, tower fashion, one above another, the functional units containing components which produce considerable heat, especially for data processing.

2. Description of the Prior Art

Particularly in data processing, functional units are frequently contained in a cabinet, the functional units having electrical components which produce considerable heat. The functional units are arranged in tower fashion one above another. For cooling and for discharging the air, fans are provided for the individual functional units, by means of which the hot air is frequently only blown out at the top of the cabinets. It is frequently also desirable, however, to discharge the hot air at another location.

SUMMARY OF THE INVENTION

An object of the present invention is to provide a ventilation system which permits the hot air to be discharged from the cabinet in the horizontal direction at a location which is at the mid-height of the cabinet.

To achieve this object, the ventilation system according to the invention has four identical fan units arranged inside and at a middle (relative to its height) of a cabinet. The fan units are arranged in pairs with two fan units of each pair disposed one above the other and one rotated with respect to the other by 180°. The two fan unit pairs are disposed next to each other. Each fan unit has a fan housing which is open at its two longitudinal sides and in which there is at least one axial-intake radial discharge fan (diagonal fan) which is arranged with its axis of rotation perpendicular to the bottom surface and top surface of the fan housing, that. In one pair, the two fan units lie directly one above the other, whereas fan units the two of the other pair are arranged a distance apart thus forming a horizontal air duct between them. The respective backs or fronts of the fan units are covered or blocked by structural elements of the cabinets.

Part of the cabinet door or of the rear wall can be used in this case as the blocking structural element, depending on the desired discharge opening for the hot air. In addition, cross-members or covers can also be provided in the interior of the cabinet for the blocking.

Since the two fan units in each pair are oriented with one fan unit rotated by 180° relative to the other, the respective air intake directions of the two fan units in each pair are directed toward each other, and thus the fan units in a pair draw air away from the respective functional unit which they face. As a result of the aforementioned blocking, the fan units of the pair disposed directly above one another discharge air sideways into the duct formed between the fan units of the other pair, the duct conducting the discharged air out of the cabinet. Those spaced-apart fan units, in turn, as a result of the partitioning discharge air sideways out of the cabinet.

These measures make it possible for the air flow in the cabinet to be deflected from the vertical into the horizontal direction in a simple manner. As a result, the functional units can be ventilated in an optimum manner, and by this means it is also made possible for the hot air to be discharged at the back or front of the particular cabinet.

The direction in which the air is discharged is determined in a simple manner by varying the installation positions of the four fan units.

DESCRIPTION OF THE DRAWINGS

FIGS. 2a, 2b and 2c respectively show a fan unit constructed in accordance with the principles of the present invention in top, side and front views and FIG. 2d shows a side view of the other fan unit of that pair.

DESCRIPTION OF THE PREFERRED EMBODIMENT

Figure 1:
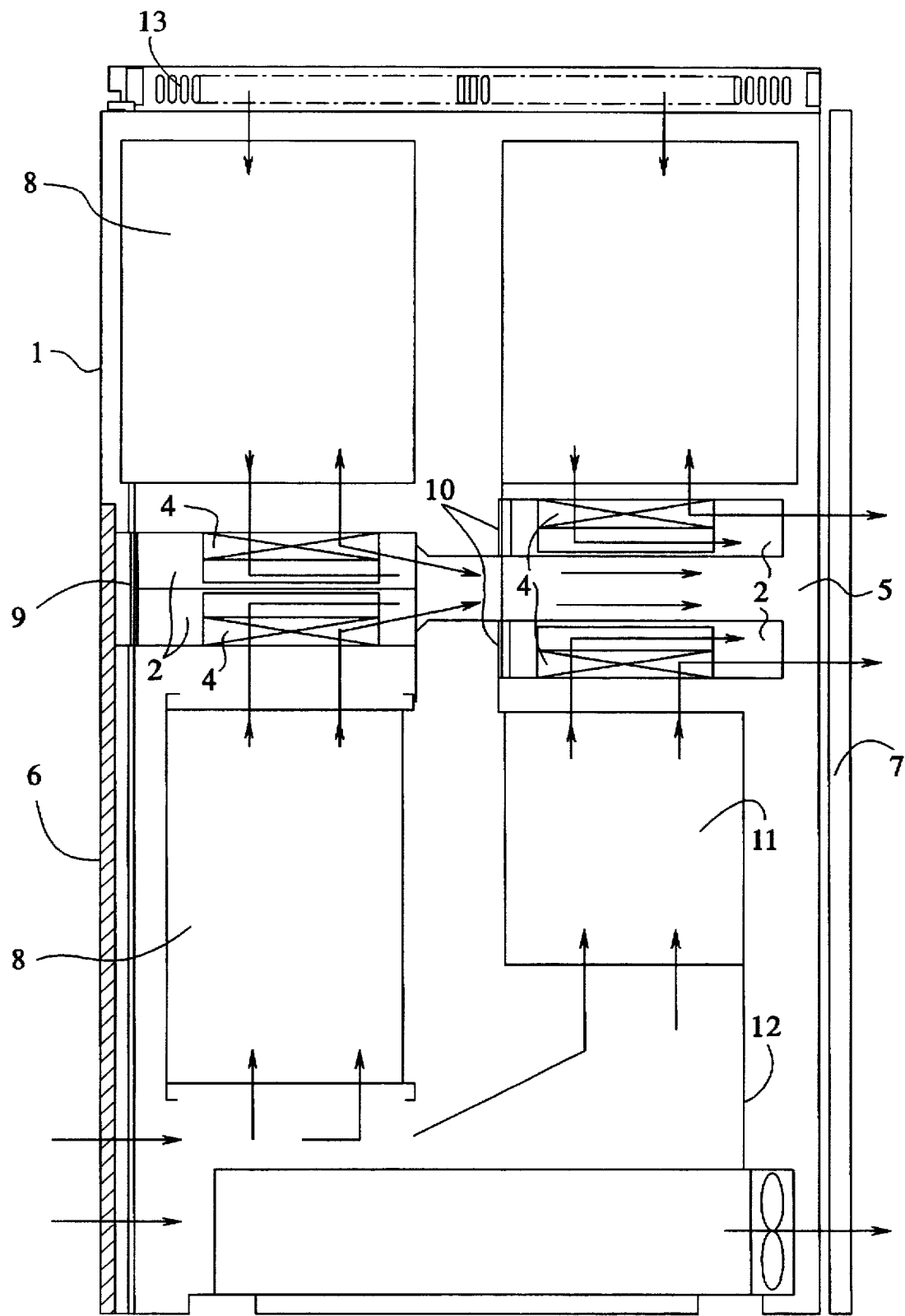
FIG. 1 shows a cabinet with functional units assembled tower fashion and with the fans installed at mid-height, constructed in accordance with the principles of the present invention.

Electronic functional units 8 are arranged, as shown in FIG. 1, tower fashion one above another in a cabinet 1. The cabinet 1 is provided at its front with a door 6 which is partly equipped with louvers 6 for the air discharge. Situated at the back of the cabinet is the cover 7 which can likewise be designed such that it is penetrable by air.

Four fan units 2 are arranged approximately in the center of the cabinet 1 so that an air flow can be generated thoroughly around both the upper and the lower functional units of the cabinet. In the present case there are two stacks of functional units 8 lying one above another. The number of tower-like assemblies can, however, vary according to use.

Each stack of functional units 8 is assigned to a pair of two fan units 2, which lie one above the other. In the case of the stack of functional units 8 near to the front door 6 the lower fan unit 2 is installed in the bottom orientation (FIG. 2d) and the upper fan unit 2 in the top orientation (FIG. 2b). In the case of the second stack, the fan units 2 are arranged above one another, but at a specified distance apart, the lower fan unit 2 likewise again being installed in the bottom orientation and the upper fan unit in the top orientation. As a result, an air duct 5 is formed through which the air discharged by the two front fan units 2 can escape at the back of the cabinet 1, whereas the air drawn in by the two back fan units 2, directly emerging horizontally from each fan unit 2, can be directly discharged at the back. All four fan units 2 are open at their rear sides, whereas they are each blocked at their front sides. The front sides of those fan units 2 which are on the front-door side are blocked at 9 by the cabinet door 6, whereas the front sides of the fan units 2 installed at the back are blocked by cross-members 10 inserted into the cabinet 11. Since the rear stack has, in its lower region, a functional unit 11 which, in length, does not completely fill the cabinet space provided, a further partition is provided here in the form of a cover 12 so as to prevent the air drawn in at the lower side of the cabinet 1 from flowing in a wrong duct ineffectively past the functional unit 11. The intake region for the functional units 8 arranged at the top in the cabinet 1 occurs via a top plate 13 which likewise has louvers, whereas the intake region for the functional units 8 in the lower part of the cabinet 1 occurs via the lower portion of the door 6 provided with louvers.

As is shown in FIG. 2, there are three axial intake-radial discharge fans 4 diagonally arranged in each fan unit 2. The longitudinal sides of the fan housing 3 are open, whereas the narrow sides are closed. Air is discharged at the two open longitudinal sides of the fan unit 2. By closing one of the longitudinal sides the discharge of air can in each case be displaced to the other longitudinal side.

Although modifications and changes may be suggested by those skilled in the art, it is the intention of the inventors to embody within the patent warranted hereon all changes and modifications as reasonably and properly come within the scope of their contribution to the art.

We claim as our invention:

1. A ventilation system for use in a cabinet having doors equipped with louvers and containing a plurality of functional units stacked in tower fashion one above another, said functional units producing heat, said ventilation system comprising:

four identical fan units, each fan unit having a housing with a top and a bottom and open longitudinal sides with at least one fan disposed in said housing, each said fan having an axial air intake and a radial air discharge and an axis of rotation disposed perpendicularly relative to said bottom and top of said housing;

said four fan units being disposed in said cabinet at a mid-height of said cabinet and being divided into two pairs of fan units, the fan units in each pair being oriented with the respective axial intakes of the respective fans being oriented directly toward each other, the fan units in a first of said pairs being disposed closely above each other, and the fan units of a second of said pairs being spaced apart and forming a horizontal air duct therebetween for directing air out of said cabinet; and a plurality of partitions mounted in said cabinet respectively adjacent said four fan units and causing said fan units in said first pair to discharge air into said horizontal air duct and causing said fan units in said second pair to discharge air out of said cabinet.

2. A ventilation system as claimed in claim 1 wherein at least one of said partitions comprises said cabinet door.

3. A ventilation system as claimed in claim 1 wherein said cabinet has a back wall, and wherein at least one of said partitions comprises said back wall.

4. A ventilation system as claimed in claim 1 wherein said cabinet has an interior cross-member, and wherein at least one of said partitions comprises said cross-member.

5. A ventilation system as claimed in claim 2 wherein said cabinet has a louvered top cover.

6. A ventilation system as claimed in claim 1 wherein each fan unit comprises three fans arranged diagonally within said housing.

* * * * *